(12) United States Patent
Wang et al.

(10) Patent No.: US 7,400,507 B2
(45) Date of Patent: Jul. 15, 2008

(54) FASTENING STRUCTURE

(75) Inventors: Frank Wang, Taipei (TW); Chih-Kai Yang, Taipei (TW)

(73) Assignee: Inventec Corporation, Taipei (TW)

( * ) Notice: Subject to any disclaimer, the term of this patent is extended or adjusted under 35 U.S.C. 154(b) by 213 days.

(21) Appl. No.: 11/255,039

(22) Filed: Oct. 19, 2005

(65) Prior Publication Data

US 2007/0086169 A1 Apr. 19, 2007

(51) Int. Cl.
*H05K 7/20* (2006.01)
*F28F 7/00* (2006.01)

(52) U.S. Cl. .................. 361/719; 361/710; 361/701; 361/702; 165/80.2; 165/185

(58) Field of Classification Search ............... 361/719, 361/697, 704, 726, 710, 701–702; 165/80.1, 165/165, 185; 174/252, 260; 257/706, 718–719; 24/626; 248/510

See application file for complete search history.

(56) References Cited

U.S. PATENT DOCUMENTS

| | | | | |
|---|---|---|---|---|
| 5,329,426 | A * | 7/1994 | Villani .................. | 361/719 |
| 5,541,811 | A * | 7/1996 | Henningsson et al. ....... | 361/704 |
| 5,640,305 | A * | 6/1997 | Smithers ................. | 361/719 |
| 5,734,556 | A * | 3/1998 | Saneinejad et al. ......... | 361/719 |
| 6,055,159 | A * | 4/2000 | Sun ..................... | 361/704 |
| 6,205,026 | B1 * | 3/2001 | Wong et al. .............. | 361/704 |
| 6,222,734 | B1 * | 4/2001 | Bookhardt et al. .......... | 361/719 |
| 6,449,154 | B1 * | 9/2002 | Yoneyama et al. .......... | 361/704 |
| 6,473,306 | B2 * | 10/2002 | Koseki et al. ............. | 361/704 |
| 6,492,202 | B1 * | 12/2002 | Lober et al. .............. | 438/122 |
| 6,683,449 | B1 * | 1/2004 | Bell et al. ................ | 324/158.1 |
| 6,714,416 | B1 * | 3/2004 | McLeod et al. ............ | 361/719 |
| 6,734,371 | B2 * | 5/2004 | Arrigotti et al. ............ | 174/260 |
| 7,183,775 | B2 * | 2/2007 | Durham et al. ............ | 324/537 |
| 2002/0181206 | A1 * | 12/2002 | Isenburg ................ | 361/720 |
| 2003/0062195 | A1 * | 4/2003 | Arrigotti et al. ............ | 174/260 |
| 2004/0027807 | A1 * | 2/2004 | Kashiwagi ............... | 361/704 |
| 2004/0052054 | A1 * | 3/2004 | Huang et al. .............. | 361/719 |
| 2004/0170001 | A1 * | 9/2004 | Lee et al. ................ | 361/719 |
| 2004/0207076 | A1 * | 10/2004 | Arrigotti et al. ............ | 257/718 |
| 2005/0117307 | A1 * | 6/2005 | Tanaka .................. | 361/719 |
| 2006/0158857 | A1 * | 7/2006 | Luckner et al. ............ | 361/719 |

FOREIGN PATENT DOCUMENTS

| TW | 0581381 | 3/2004 |
|---|---|---|
| TW | 0582586 | 4/2004 |
| TW | 0231416 | 4/2005 |

* cited by examiner

*Primary Examiner*—Anatoly Vortman
*Assistant Examiner*—Bradley H Thomas
(74) *Attorney, Agent, or Firm*—Venable LLP; Raymond J. Ho

(57) ABSTRACT

A fastening structure for securing a heatsink module is provided. The structure includes at least a first fastening piece attached to the circuit board and having a first fastening member, a heat spreader having its attached side connected to the heatsink module, hence able to swing vertically, and a pair of first positioning members protrudingly provided on the thermal spread; a second fastening piece having a second fastening member to connect to the first fastening member and a fulcrum to suppress the heat spreader, the second fastening piece having suitable elasticity for the second fastening member to swing vertically and axially around the fulcrum; and a suppressing member having a pair of second positioning members to engage the first positioning members and having a portion press against the top of fulcrum to ensure the state of engagement between the first fastening piece and the second fastening piece.

11 Claims, 4 Drawing Sheets

A-A

B-B

FASTENING STRUCTURE

BACKGROUND OF THE INVENTION

1. Field of the Invention

The present invention relates to a fastening structure, more particularly a kind of fastening structure that secures a heatsink module to a circuit board in a simple manner to facilitate the heat dissipation of central processing unit (CPU) and other chips.

2. Description of the Related Art

Heatsink modules installed in computers are typically designed for the heat dissipation of a CPU which tends to produce the greatest amount of heat. The required components of casing, fan and heat tube are frequently built into one module as that disclosed in Taiwan patent number I231416 and Taiwan published numbers 582586 and 581381 to facilitate the production and installation of the heatsink module.

The modularized radiation devices disclosed in the aforementioned patents improve heat dissipation efficiency. Nevertheless, they are unable to dissipate directly heat generated by other chips on the same circuit board. Thus, even though those heatsink modules offer good efficiency, they fail to enhance the overall heat dissipation efficiency of the computer.

In addition, a conventional heatsink module is fastened to the circuit board by screws. Improper screwing resulting from an incorrect force or method used by the operator might affect the performance of the heatsink module, or even damage the module or the circuit board.

SUMMARY OF THE INVENTION

Addressing the drawbacks of prior art the object of the present invention is to provide a fastening structure that offers better heat dissipation for two or more chips on a circuit board.

Another object of the present invention is to provide a fastening structure attached to the CPU heatsink module, which fastens the heatsink module to a circuit board and forcibly cools a chip.

To achieve the aforesaid objects, the present invention provides a fastening structure including at least a first fastening piece secured to a circuit board and having a first fastening member; a heat spreader having a predetermined area extending over a predetermined portion of the circuit board and its fixed portion connected to a corresponding portion of a heatsink module, hence able to swing vertically; and a second fastening piece having a second fastening member to engage the first fastening member and a fulcrum to suppress the upper end surface of the heat spreader, the second fastening piece having suitable elasticity for the second fastening member to swing vertically and axially around the fulcrum.

The working of the elements described above allows the heat to transfer to parts of the heatsink module in order to get in contact with a CPU and/or another chip through the fastening structure, thereby improving the overall heat dissipation efficiency of the circuit board with such a fastening structure thereon.

The objects, features and functions of the present invention are explained in detail below with an example and accompanying drawings.

DETAILED DESCRIPTION OF THE INVENTION

Figure 1:
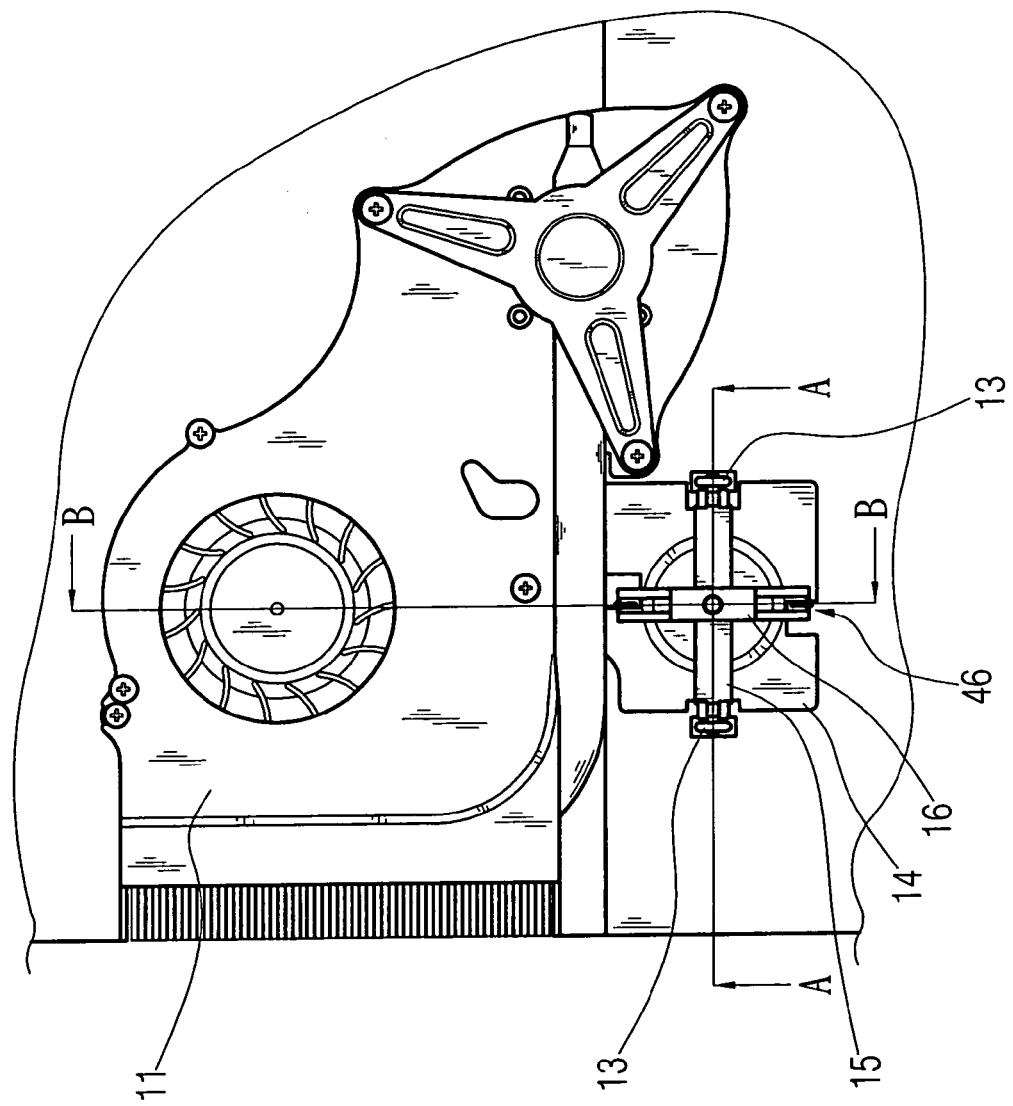
FIG. 1 is a top view of an example of the invention.
Figure 2:
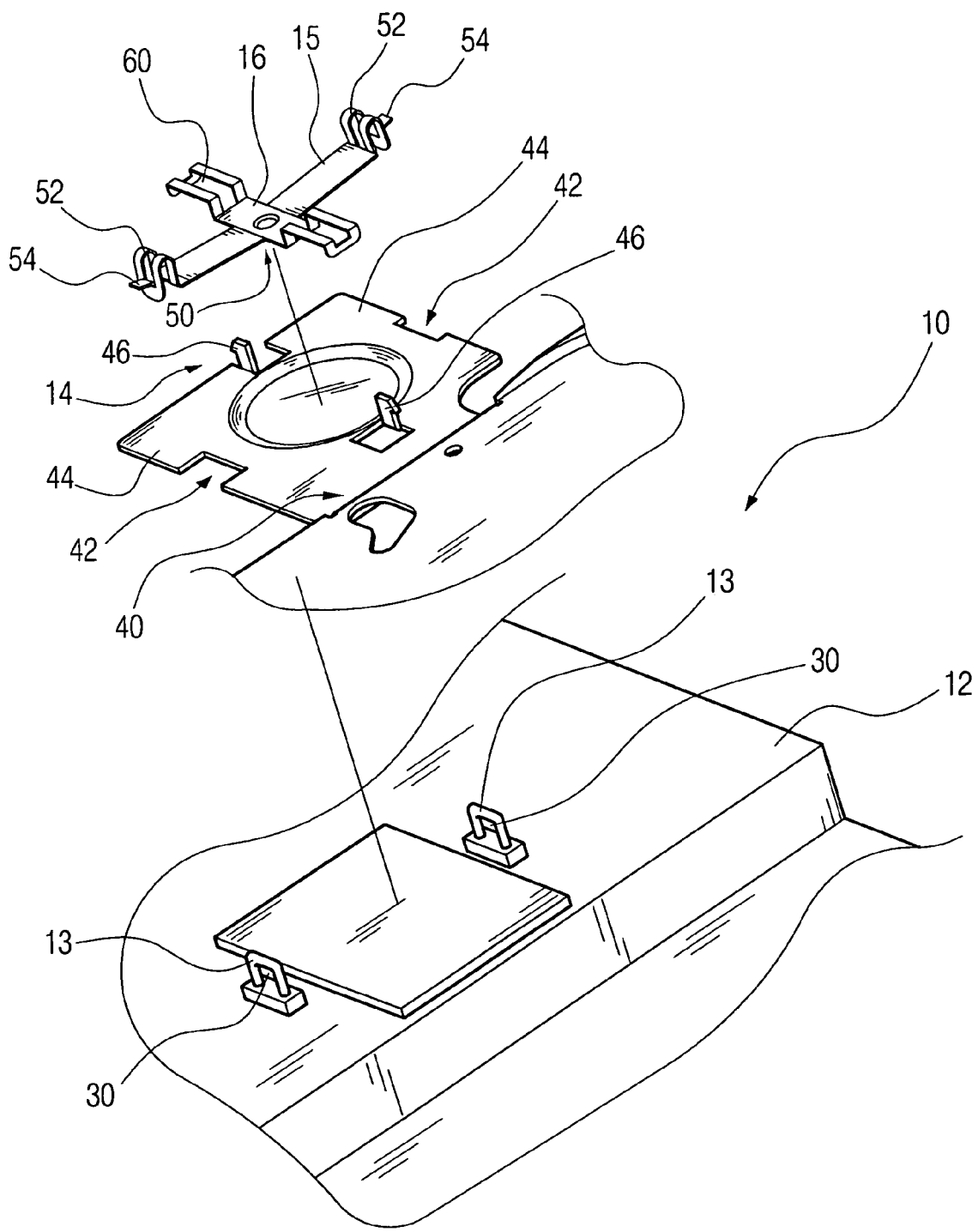
FIG. 2 is an exploded view of an example of the invention.
Figure 3:
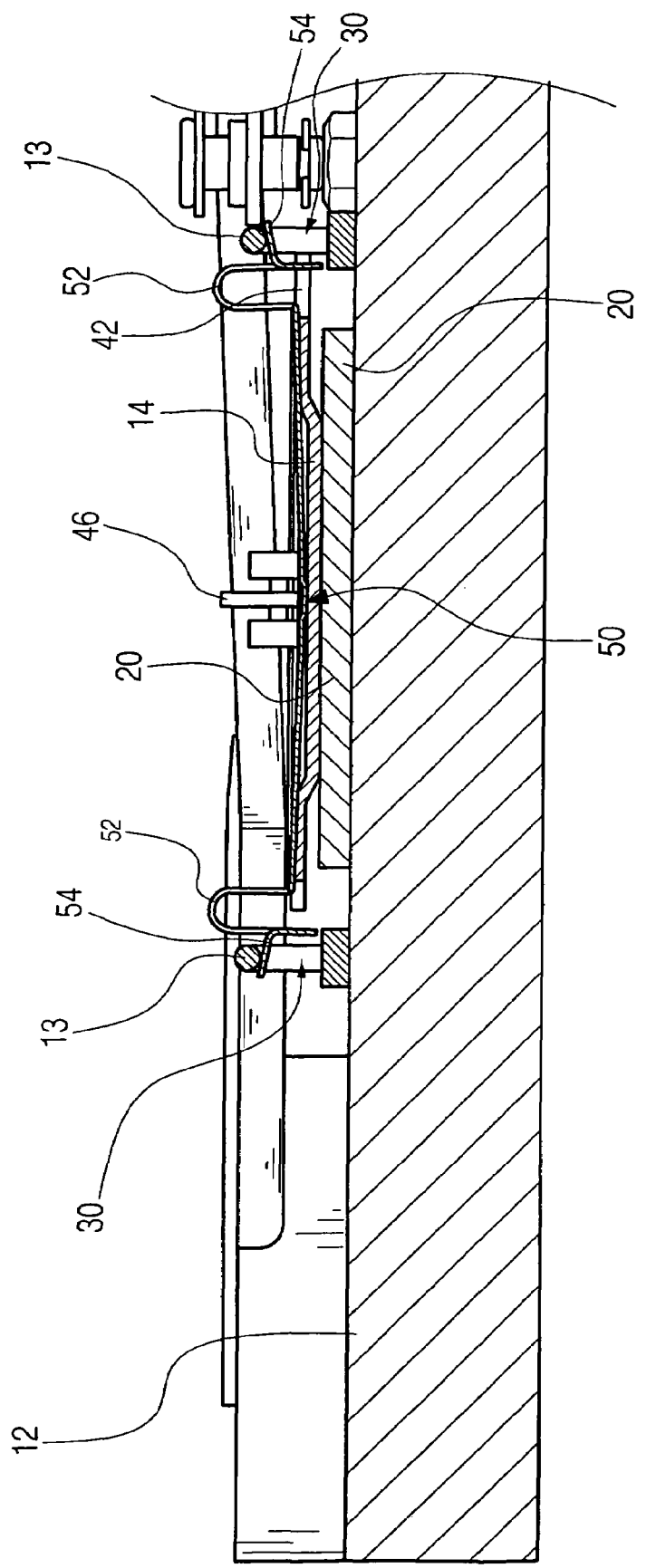
FIG. 3 is a sectional view of an example of the invention along the A-A direction in FIG. 1.
Figure 4:
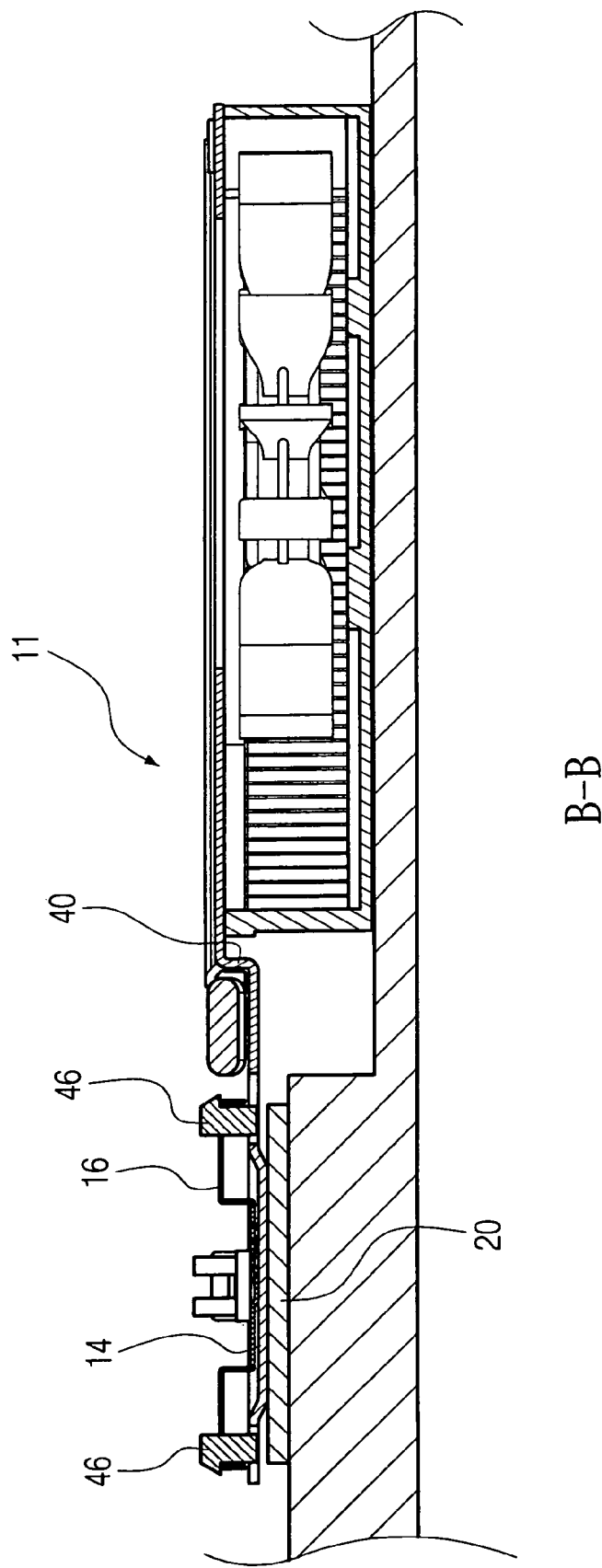
FIG. 4 is a sectional view of an example of the invention along the B-B direction in FIG. 1.

Referring to FIG. 1 to FIG. 4, the working of the fastening structure 10 provided in the present invention is characterized by securing a heatsink module 11 to a circuit board 12 to keep it in contact with a CPU and another chip 20 simultaneously. The fastening structure 10 includes, primarily, a pair of first fastening pieces 13, a heat spreader 14, and a second fastening piece 15.

The first fastening pieces 13 are respectively disposed on the circuit board 12 at a proper distance apart and in a ring shape in order to form a first fastening member 30 with an aperture on the same axis line.

The heat spreader 14 is a metal piece in a somewhat rectangular shape. The heat spreader 14 includes a fixed portion 40 which is connected to the outer casing of the heatsink module 11 in one body, so the heat spreader 14 can swing vertically (based on the direction of the figure) to an extent and axially around the fixed portion 40. The heat spreader 14 further includes a pair of notches 42 disposed at the center of the two mobile sides 44 adjacent to the fixed portion 40 of the heat spreader 14.

The second fastening piece 15 is a long-strip metal piece with proper length and elasticity formed in one piece molding. The second fastening piece 15 includes a fulcrum 50 at its center section, two connecting members 52 in inverse U-shape on each end, and two second fastening members 54 in inverse hook shape. The two second fastening members 54 are respectively disposed at the outer side of the corresponding connecting members 52 so as to enable the second fastening members to swing somewhat horizontally (based on the direction of the figure) and axially around the middle section of connecting member 52.

For assembly, the heat spreader 14 is disposed on the top of the circuit board 12 and thus a heat-generating chip 20 is disposed between the heat spreader 14 and the circuit board 12. The corresponding first fastening pieces 13 are engaged with the notches 42 to help the operator determine the correct position. Next, the second fastening members 54 are respectively inserted into the corresponding first fastening members 30. The second fastening piece 15 having elasticity is able to swing vertically and axially around fulcrum 50. The fulcrum 50 is forced to press the heat spreader 14 down. The connecting members 52 similarly having proper elasticity can be used to stabilize and maintain the connection between the first fastening piece 13 and the second fastening piece 15. As such, the heat generated from chip 20 is rapidly conducted to the heat spreader 14 and the heat from the heat spreader 14 is then dissipated by the heatsink module 11.

To enhance the union between the fastening structure 10 and the circuit board 12, the present invention further disposes two first positioning members 46. The two first positioning members 46 are an inverse hook shape at a proper distance apart on the head spreader 14 in one piece. There is an imaginary line drawn between the two first positioning members 46, which is exactly perpendicular to an imaginary line drawn between the two notches 42.

A suppressing member 16 is a bow-shape metal piece with proper length and elasticity. The middle section of the suppressing member 16 is secured to the top of fulcrum 50 in a manner so that its long-axis is perpendicular to the second fastening piece 15. A second positioning member 60 with a long aperture is formed respectively at each end of the suppressing member 16.

For operation, the first fastening pieces 13 engage with the corresponding second fastening pieces 15, and the first positioning members 46 respectively pass through the corresponding second positioning members 60 to hook the end of the long aperture. The downward bending middle section of the suppressing member 16 is pressed against the top of fulcrum 50 and prevents the elastic force from the second fastening pieces 15 from being directly transferred to the second positioning members 60. Hence, the state of secure engagement between the first fastening pieces 13 and the second fastening pieces 15 can be maintained.

The description above is merely a preferred embodiment of the invention which should not be construed as a limitation on the scope of claims. All modifications and alterations by those familiar with the skill without departing from the spirits of the invention shall remain within the protected scope and claims of the invention.

What is claimed is:

1. A fastening structure, comprising:
    at least a first fastening piece, secured to a circuit board, the first fastening piece having a first fastening member;
    a heat spreader, contacting a thermal source to conduct the heat from the thermal source to the heat spreader, the heat spreader having a predetermined area extending over a predetermined portion of the circuit board and having a fixed portion, the fixed portion connected to a corresponding portion of a heatsink module to dissipate the heat from the heat spreader to the heatsink module, hence being able to swing vertically; and
    a second fastening piece, the second fastening piece deposited on the heat spreader and contacting the heat spreader, having a second fastening member and a fulcrum, the second fastening member connecting to the first fastening member, the fulcrum suppressing an upper end surface of the heat spreader, the second fastening piece having suitable elasticity for allowing the second fastening member to swing vertically and axially around the fulcrum,
    wherein the heat spreader is disposed with two first positioning members at a predetermined distance apart; a suppressing member having a predetermined length and straddling over the second fastening piece, with a second positioning member at each of its two ends for connecting to the corresponding first positioning members.

2. The fastening structure according to claim 1, wherein the fastening structure comprises two first fastening pieces at a predetermined distance apart and each of the first fastening pieces having a first fastening member, and the second fastening piece having a predetermined length and two second fastening members disposed at the two ends of the second fastening piece to connect to the corresponding first fastening members.

3. The fastening structure according to claim 2, wherein the fulcrum is disposed between the two second fastening members to allow the two second fastening members to swing vertically and axially around it.

4. The fastening structure according to claim 2, wherein the heat spreader is sandwiched between the two first fastening pieces.

5. The fastening structure according to claim 2, wherein the second fastening piece is further disposed with a connecting member having predetermined elasticity and the second fastening member is disposed at the end of the connecting member and able to swing horizontally and axially around a predetermined portion of the connecting member.

6. The fastening structure according to claim 5, wherein the connecting member is an inverse U-shape and disposed at the end of the second fastening piece in one piece.

7. The fastening structure according to claim 1, wherein the second fastening piece is further disposed with a connecting member having predetermined elasticity and the second fastening member is disposed at the end of the connecting member and able to swing horizontally and axially around a predetermined portion of the connecting member.

8. The fastening structure according to claim 7, wherein the connecting member is an inverse U-shape and disposed at the end of the second fastening piece in one piece.

9. The fastening structure according to claim 1, wherein the suppressing member has a middle section secured to a predetermined portion of the second fastening piece.

10. The fastening structure according to claim 9, wherein the second positioning member can swing vertically and axially around the middle section of the suppressing member.

11. The fastening structure according to claim 1, wherein the heat spreader is made of a metallic material.

* * * * *